(12) United States Patent
Huh et al.

(10) Patent No.: US 12,430,880 B2
(45) Date of Patent: Sep. 30, 2025

(54) METHOD AND SYSTEM PERFORMING PATTERN CLUSTERING

(71) Applicant: SAMSUNG ELECTRONICS CO., LTD., Suwon-si (KR)

(72) Inventors: In Huh, Seoul (KR); Younggu Kim, Hwaseong-si (KR); Changwook Jeong, Hwaseong-si (KR); Jaemyung Choe, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 380 days.

(21) Appl. No.: 18/095,887

(22) Filed: Jan. 11, 2023

(65) Prior Publication Data
US 2023/0230348 A1    Jul. 20, 2023

(30) Foreign Application Priority Data
Jan. 20, 2022    (KR) .................... 10-2022-0008692

(51) Int. Cl.
| | | |
|---|---|---|
| *G06F 16/55* | (2019.01) | |
| *G06F 16/56* | (2019.01) | |
| *G06V 10/762* | (2022.01) | |
| *G06V 10/77* | (2022.01) | |
| *G06V 10/774* | (2022.01) | |

(52) U.S. Cl.
CPC .......... *G06V 10/762* (2022.01); *G06F 16/55* (2019.01); *G06F 16/56* (2019.01); *G06V 10/7715* (2022.01); *G06V 10/774* (2022.01)

(58) Field of Classification Search
None
See application file for complete search history.

(56) References Cited

U.S. PATENT DOCUMENTS

| | | |
|---|---|---|
| 8,079,005 B2 | 12/2011 | Lai et al. |
| 9,690,898 B2 | 6/2017 | Graur et al. |
| 10,373,056 B1 | 8/2019 | Andoni et al. |
| 10,592,635 B2 | 3/2020 | Sha et al. |
| 10,621,301 B2 | 4/2020 | Sha et al. |
| 10,699,055 B2 | 6/2020 | Sha et al. |

(Continued)

FOREIGN PATENT DOCUMENTS

| | | | |
|---|---|---|---|
| CN | 110281231 A | * 9/2019 | ............ B25J 9/1697 |
| JP | 4139664 B2 | * 8/2008 | |

OTHER PUBLICATIONS

Tristan Bepler et al., "Explicitly Disentangling Image Content From Translation and Rotation With Spatial-Vae," 33rd Conference on Neural Information Processing Systems (NEURIPS 2019), Vancouver, Canada.

(Continued)

*Primary Examiner* — Bernard Krasnic
(74) *Attorney, Agent, or Firm* — Fish & Richardson P.C.

(57) ABSTRACT

A method of clustering patterns of an integrated circuit includes; providing a pattern image and numeric data, as input data corresponding to a first pattern to a first model, wherein the first model is trained by a plurality of sample images and a plurality of sample values, obtaining a content latent variable using the first model, and grouping a plurality of content latent variables corresponding to a plurality of patterns into a plurality of clusters based on a Euclidean distance, wherein the numeric data represents at least one attribute of the first pattern.

19 Claims, 20 Drawing Sheets

(56) References Cited

U.S. PATENT DOCUMENTS

| | | |
|---|---|---|
| 10,832,092 B2 | 11/2020 | Shaubi et al. |
| 11,049,243 B2 | 6/2021 | Odry et al. |
| 2020/0334543 A1 | 10/2020 | Park et al. |
| 2020/0372365 A1 | 11/2020 | Cecil |
| 2021/0256761 A1 | 8/2021 | Mahdizadehaghdam et al. |
| 2022/0245851 A1* | 8/2022 | Xu ........................... G06T 7/97 |

OTHER PUBLICATIONS

Diederik P. Kingma et al., "Auto-Encoding Variational Bayes", 14 pages, Year: 2014.

* cited by examiner

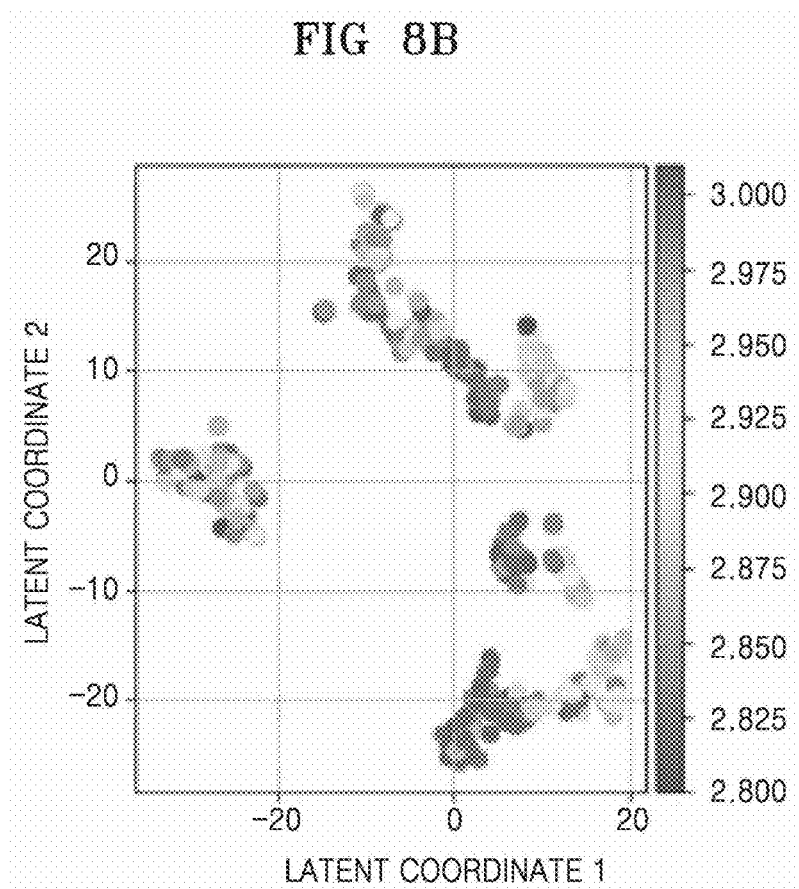

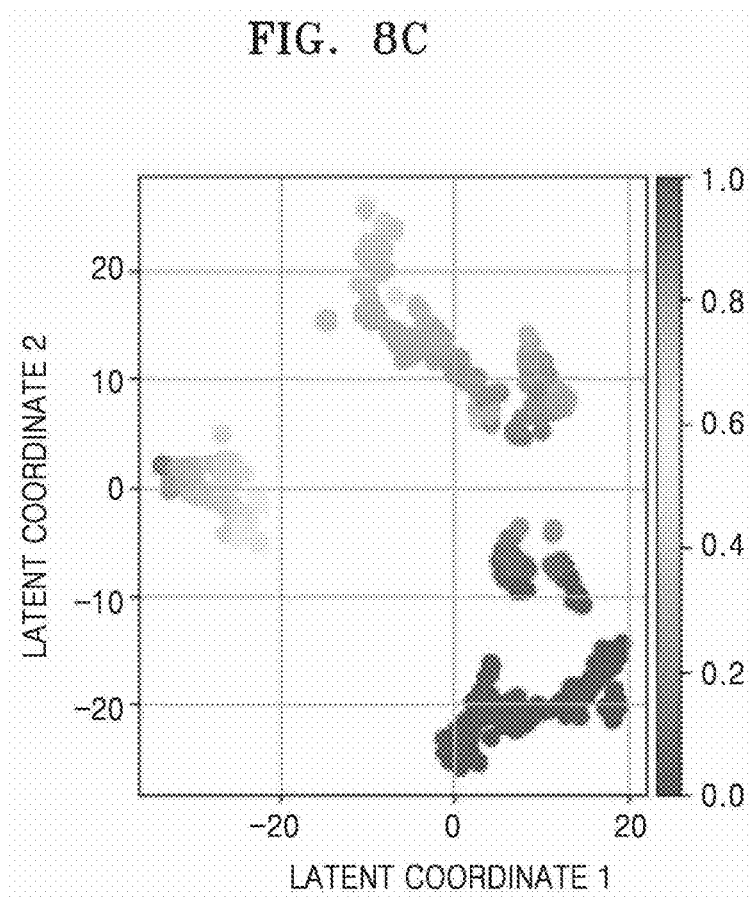

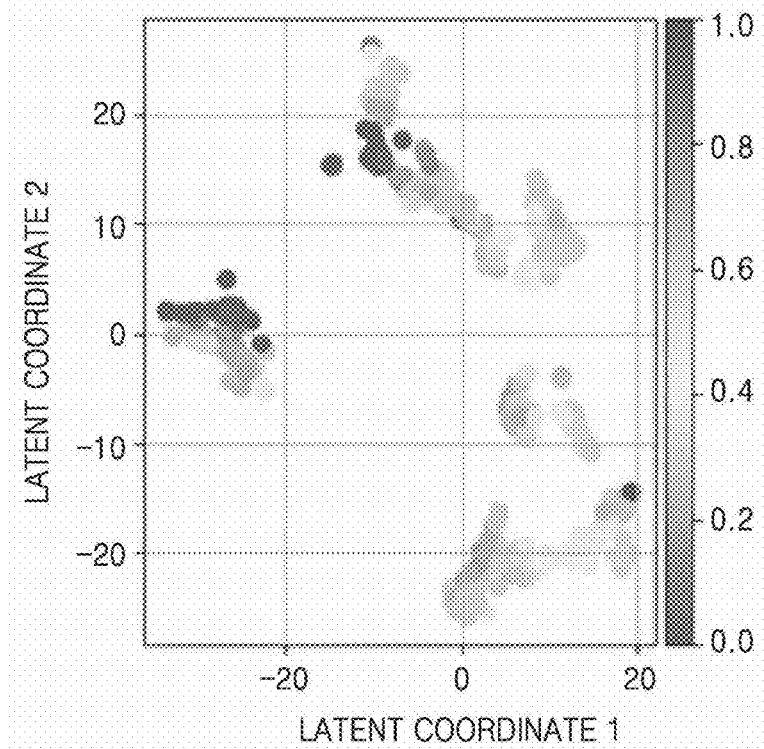

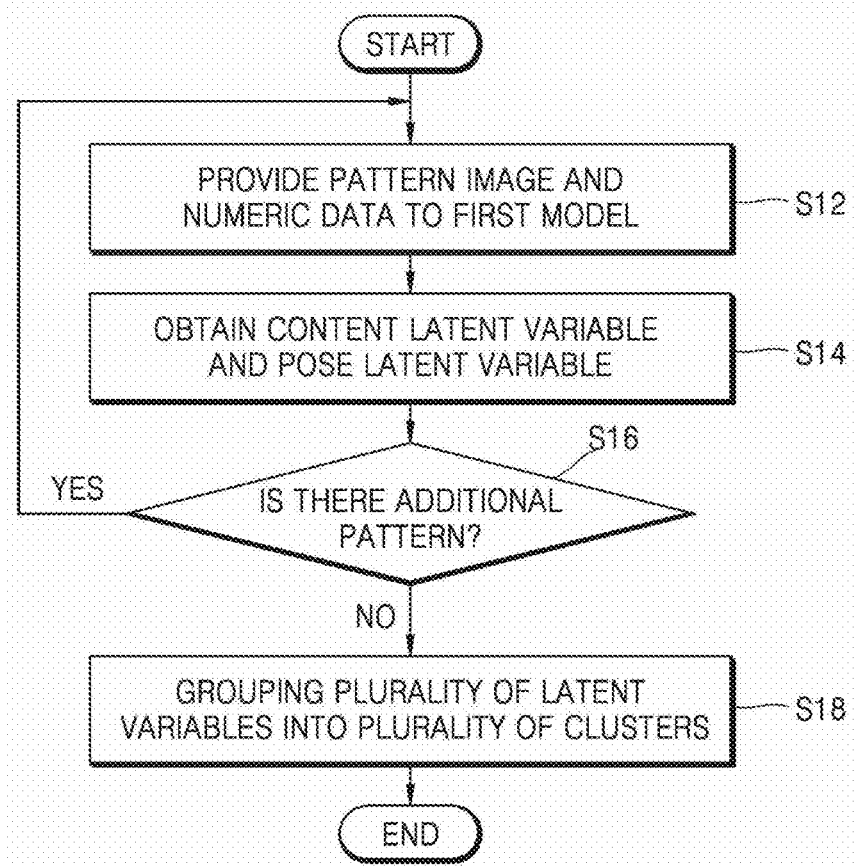

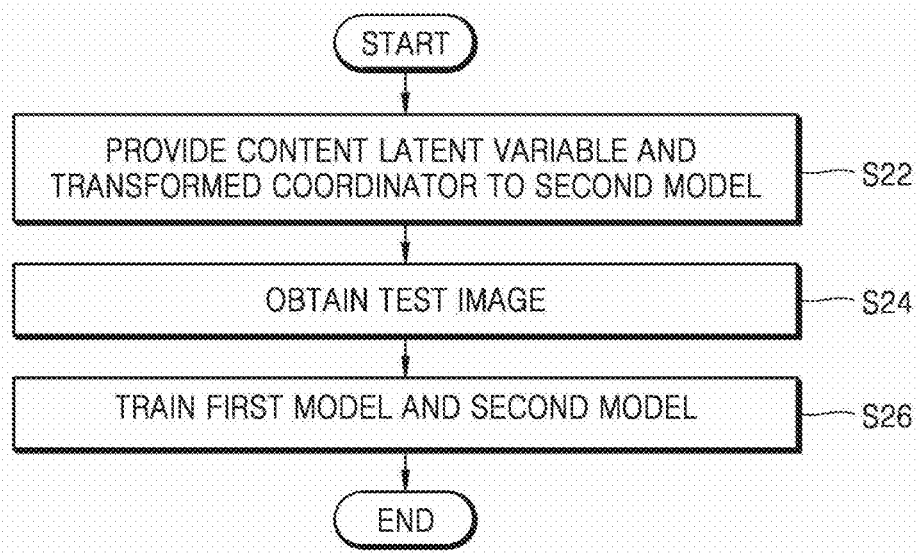

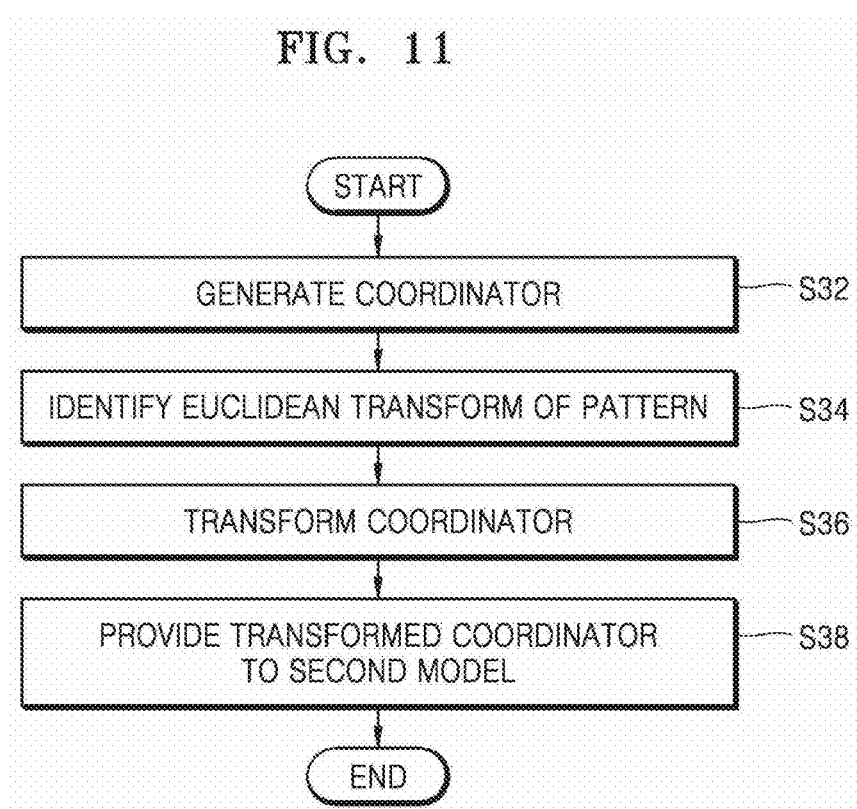

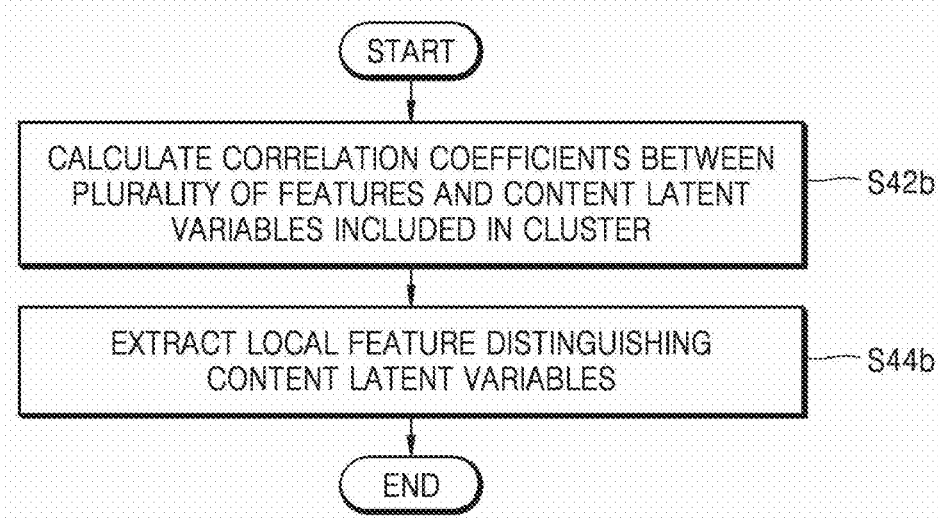

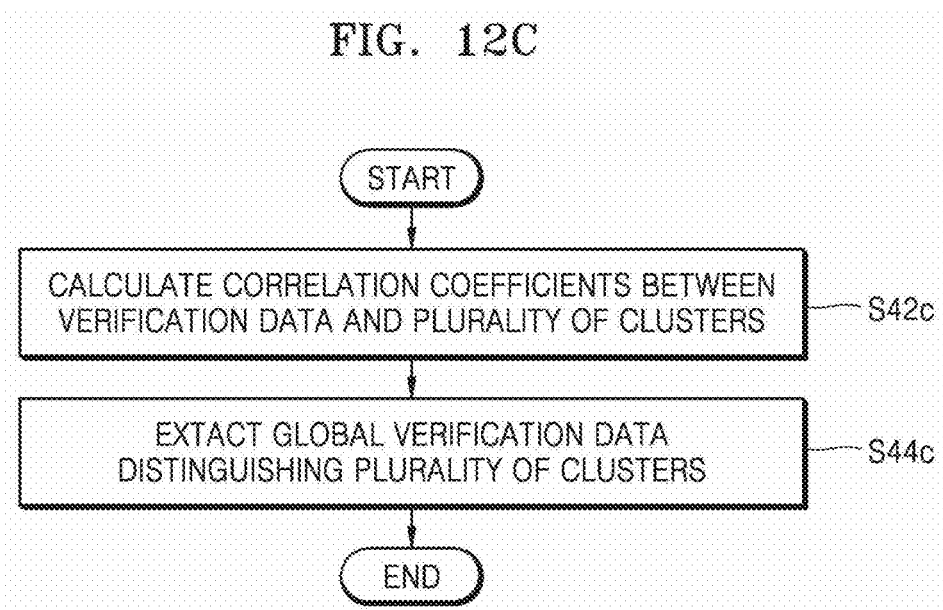

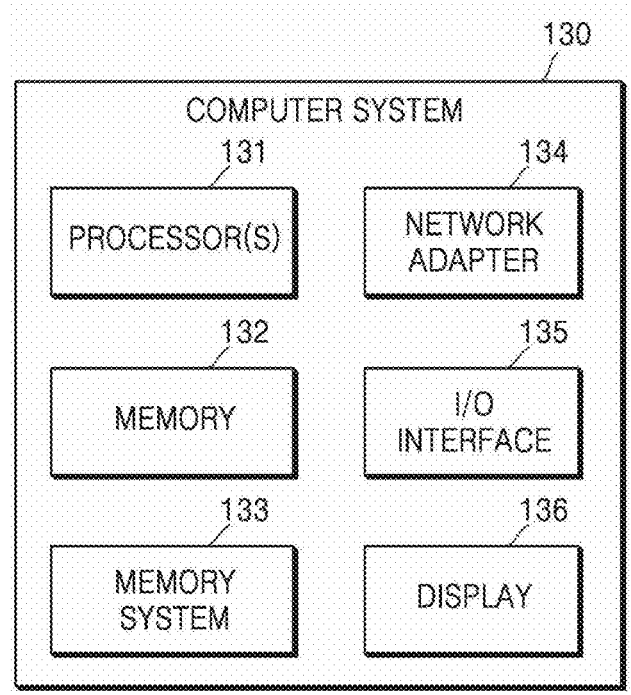

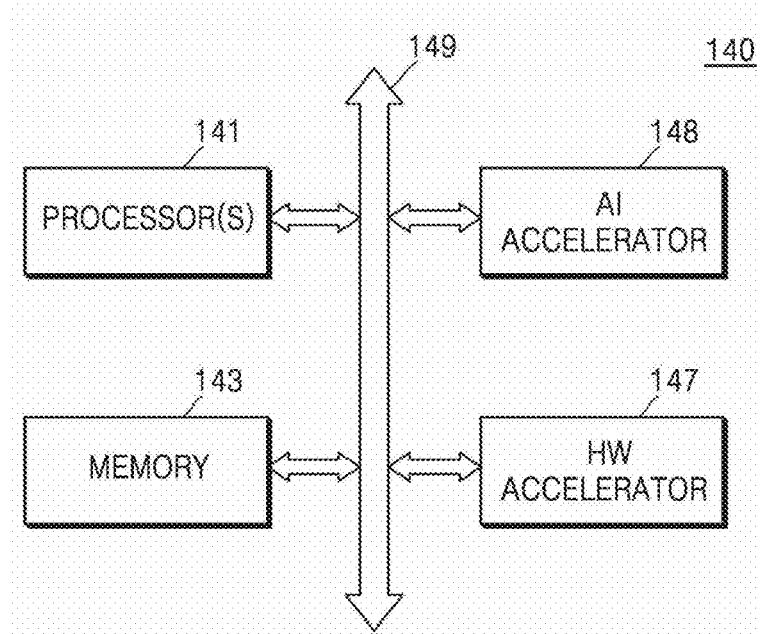

METHOD AND SYSTEM PERFORMING PATTERN CLUSTERING

CROSS-REFERENCE TO RELATED APPLICATION

This U.S. nonprovisional patent application claims priority under 35 U.S.C. § 119 to Korean Patent Application No. 10-2022-0008692 filed on Jan. 20, 2022 in the Korean Intellectual Property Office, the subject matter of which is hereby incorporated by reference in its entirety.

BACKGROUND

The inventive concept relates generally to modeling of integrated circuit(s), and more particularly, to methods and systems performing pattern clustering.

Efficiency and accuracy in the design and development of an integrated circuit may be improved through the analysis and verification of patterns associated with the integrated circuit. Such analysis and verification of patterns may also improve the reliability of the integrated circuit. In this regard, as semiconductor processes continue to evolve, contemporary and emerging integrated circuits may include patterns of increasingly diverse type. As a result, it has become impractical to prior-classify, analyze and/or verify every pattern possibly included in an integrated circuit. Accordingly, a method capable of efficiently and accurately analyzing and verifying patterns is deemed desirable.

SUMMARY

Embodiments of the inventive concept provide methods and systems capable of efficiently providing analysis and/or verification of patterns associated with an integrated circuit by clustering of the patterns.

According to an aspect of the inventive concept, a method of clustering patterns associated with an integrated circuit may include; for each pattern among a plurality of patterns, providing a pattern image to a first model, wherein the first model is trained using a plurality of sample images, and generating a content latent variable and a pose latent variable using the first model in response to the pattern image, wherein the pose latent variable has a value corresponding to an Euclidean transform of each pattern; and thereafter, grouping a plurality of content latent variables, each respectively corresponding to a pattern among the plurality of patterns, into a plurality of clusters corresponding to the plurality of pattern based on a Euclidean distance.

According to an aspect of the inventive concept, a method of clustering patterns associated with an integrated circuit may include; providing a pattern image and numeric data, as input data corresponding to a first pattern to a first model, wherein the first model is trained by a plurality of sample images and a plurality of sample values, obtaining a content latent variable using the first model, and grouping a plurality of content latent variables corresponding to a plurality of patterns into a plurality of clusters based on a Euclidean distance, wherein the numeric data represents at least one attribute of the first pattern.

According to an aspect of the inventive concept, a method of clustering patterns associated with a system may include; at least one processor, and a non-transitory storage medium storing instructions, which when executed by the at least one processor, allows the at least one processor to cluster patterns of an integrated circuit, wherein clustering of patterns includes; providing a pattern image corresponding to a first pattern to a first model, wherein the first model is trained by a plurality of sample images, obtaining a first content latent variable and a first pose latent variable from the first model, and grouping a plurality of content latent variables corresponding to a plurality of patterns into a plurality of clusters based on a Euclidean distance, wherein the first pose latent variable represents a Euclidean transform of the first pattern with respect to a representative pattern of a first cluster including the first content latent variable.

BRIEF DESCRIPTION OF THE DRAWINGS

Advantages, benefits, and features, as well as the making and use of the inventive concept may be more clearly understood upon consideration of the following detailed description together with the accompanying drawings, in which:

FIGS. 8A, 8B, 8C and 8D are respective diagrams illustrating examples of latent space mapping according to embodiments of the inventive concept;

FIGS. 9, 10 and 11 are respective flowcharts variously illustrating methods of a pattern clustering according to embodiments of the inventive concept;

FIGS. 12A, 12B, 12C and 12D are respective flowcharts illustrating various methods of pattern clustering according to embodiments of the inventive concept;

FIG. 13 is a block diagram illustrating a computer system according to embodiments of the inventive concept; and FIG. 14 is a block diagram illustrating a system according to embodiments of the inventive concept.

DETAILED DESCRIPTION

Throughout the written description and drawings, like reference numbers and labels are used to denote like or similar elements, components, features and/or method steps.

Figure 1:
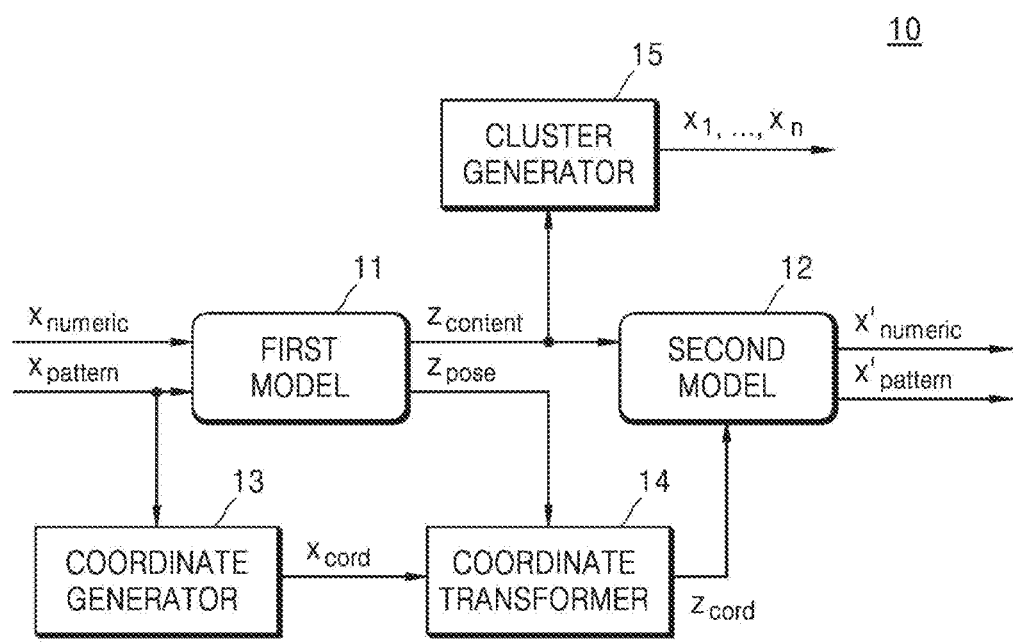
FIG. 1 is a block diagram illustrating a pattern clustering system according to embodiments of the inventive concept.

Figure (FIG. 1 is a block diagram illustrating a pattern clustering system 10 according to embodiments of the inventive concept. Here, the pattern clustering system 10 may be used to generate latent variables corresponding to a pattern in response to received input data representing a pattern. The pattern clustering system 10 may then group a plurality of latent variables corresponding to a plurality of patterns and generate clusters of latent variables, and accordingly, clusters of patterns. Patterns included in a cluster (or in a grouping) may share at least one similar attribute. Accordingly, by analyzing clusters of patterns—instead of analyzing all patterns included in the integrated circuit—the integrated circuit may be efficiently analyzed and verified. In this regard, a "pattern" may be understood as a defined portion of a layout of the integrated circuit, including at least one structure formed on a material layer or a substrate. As conceptually illustrated in FIG. 1, the pattern clustering system 10 may include a first model 11, a second model 12, a coordinate generator 13, a coordinate transformer 14, and a cluster generator 15.

In some embodiments, pattern clustering, like the example illustrated in FIG. 1, may be implemented using a computing system. (See, e.g., FIGS. 13 and 14, and the related written description hereafter). The computing system may include one or more functional blocks (or units) variously implemented in hardware, firmware and/or software. In this regard, hardware may include at least one of a programmable component, such as a central processing unit (CPU), a digital signal processor (DSP), and a graphics processing unit (GPU). Alternately or additionally, hardware may include a reconfigurable component, such as a field programmable gate array (FPGA), and/or a component providing a fixed functionality, such as a defined intellectual property (IP). In some embodiments, software may include at least one of a series of executable instructions and/or programming code transformable into a series of executable instructions (e.g., using a compiler, etc.). Here, software may be stored in non-transitory storage medium.

As noted above, as semiconductor processes continue to develop and/or evolve, it has become impractically to fully analyze a great number of patterns associated with an integrated circuit having a high degree of integration. Accordingly, the integrated circuit may be analyzed by clustering (or grouping) patterns associated with the integrated circuit based on (or in relation to) attribute(s) distinguishing respective clusters, a dispersion or tendency of attribute(s) extracted from patterns included in a cluster, etc.

For example, clustering of patterns may be accomplished in relation to a distance or similarity identified between patterns. That is, patterns having a relatively short distance (e.g.,) from an arbitrary point or high degree of attribute similarity may be grouped together in a cluster. In this regard, patterns corresponding to latent variables close to each other in latent space may be deemed to have similar attributes. As will be described hereafter in some additional detail, the pattern clustering system 10 may effectively "map" a pattern to one point in latent space (e.g., a representation space). That is, the pattern clustering system 10 may map a pattern to a latent variable, and then "group" patterns having a relatively low Euclidean distance in latent space into a cluster. In this manner, patterns associated with an integrated circuit may be effectively "clustered," wherein each resulting cluster may exhibit or be characterized by at least one attribute. Thereafter, various patterns may be more readily analyzed based on clusters, thereby allowing the even very densely integrated circuits to be efficiently analyzed and verified.

Referring to FIG. 1, input data, from which a latent variable may be derived, may include a pattern image ($x_{pattern}$) and numeric data ($x_{numeric}$). The pattern image $x_{pattern}$ may represent a pattern portion (e.g., a designated region or pattern) of an integrated circuit layout. Here, a layout portion of the integrated circuit may be referred to an "image," and a material layer or substrate of the integrated circuit may be referred to as a "layer."

Using this nomenclature, a layer or an image requiring analysis may be extracted from data defining the layout of the integrated circuit. In this regard, the pattern image $x_{pattern}$ may be pattern obtained by sub-dividing the extracted layer using a window of predetermined size. Thus, the pattern image $x_{pattern}$ may include two-dimensional (2D) geometric information. In some embodiments, when a pattern includes structures formed in relation to a number of layers, the pattern image $x_{pattern}$ may include multiple 2D arrays, wherein each of the 2D arrays corresponds to a respective layer. For example, assuming a 2D array is arranged in a matrix of 50×50 pixels, corresponding pattern image(s) $x_{pattern}$ for each layer may have a size of 50×50.

Referring to FIG. 1, the numeric data $x_{numeric}$ may indicate information related to a pattern that is not included in the pattern image $x_{pattern}$ (hereafter, a "non-included pattern"). For example, a non-included pattern may have an attribute not represented by a 2D image (hereafter, a "non-represented attribute"). Under such conditions, the numeric data $x_{numeric}$ may be used to represent non-represented attribute(s). In this regard, the numeric data $x_{numeric}$ may include; information related to a vertical direction (e.g., a stacking direction for layers) of a layer, information related to a thickness, an angle, or some other geometric aspect of a layer, information related to material(s) included in a layer, etc. By use of the numeric data $x_{numeric}$ in addition to the pattern image $x_{pattern}$, the input data applied to the first model 11 may more accurately define a pattern.

As conceptually illustrated in FIG. 1, the first model 11 may receive the pattern image $x_{pattern}$ and the numeric data $x_{numeric}$, and may output a content latent variable ($z_{content}$) and a pose latent variable ($z_{pose}$). Here, in some embodiments, the first model 11 may correspond to a machine learning model trained in relation to (or using) a plurality of sample images and a plurality of sample values. In some embodiments, the machine learning model may include a deep neural network.

In some embodiments, the first model 11 may include mutually independent models. For example, the first model 11 may include one model trained to receive the pattern image $x_{pattern}$ and generate (or "output") a first content latent variable and a pose latent variable $z_{pose}$, and another model trained to receive numeric data $x_{numeric}$ and output a second content latent variable. Accordingly, the first model 11 may generate a content latent variable $z_{content}$ based on operations using the first content latent variable and the second content latent variable. In this regard, the first model 11 may generate a content latent variable $z_{content}$ by summing, multiplying, and/or concatenating the first content latent variable and/or the second content latent variable. One possible example of the first model 11 will be described hereafter in some additional detail with reference to FIG. 3.

Conceptually, the content latent variable $z_{content}$ may correspond to a single point in latent space, and may have values respectively corresponding to attributes of a pattern defined by the pattern image $x_{pattern}$ and the numeric data $x_{numeric}$. For example, the content latent variable $z_{content}$ may have a value corresponding to a type, a shape, an area, etc., of a structure included in the pattern. As noted above, content latent variables respectively corresponding to patterns having similar attributes may have similar values, and may be disposed relatively close to each other in latent space.

The pose latent variable $z_{pose}$ may have a value corresponding to an Euclidean transform of a pattern. In this regard, the Euclidean transform may be understood as a rigid transform or a coordinate transform, and may be referred to hereafter as a geometric transform in which Euclidean distances between all point pairs are maintained. For example, the Euclidean transform may include at least one of (e.g., a sequence of) rotation, translation and reflection. With regard to the layout of the integrated circuit, a second pattern that has been Euclidean-transformed from a first pattern may have substantially similar attributes as the first pattern. Accordingly, patterns having the Euclidean transform relationship may be deemed suitable for grouping together in a cluster.

Referring to FIG. 1, the first model 11 may generate the pose latent variable $z_{pose}$ in addition to the content latent variable $z_{content}$. Accordingly, information about the Euclidean transform of patterns may be separated from the content latent variable $z_{content}$ in latent space. In some embodiments, the pose latent variable $z_{pose}$ may stochastically represent discrete Euclidean transforms. (See, e.g., the illustrated embodiment of FIG. 5). In some embodiments, the pose latent variable $z_{pose}$ may also stochastically represent continuous Euclidean transforms using a continuous probability distribution.

Here, it should be noted that a machine learning model may have an arbitrary structure capable of being trained through the use of sample data (or training data). The machine learning model may include at least one of, for example; an artificial neural network, a decision tree, a support vector machine, a Bayesian network, a genetic algorithm, etc. In the illustrated embodiments that follow, a machine learning model is assumed to be an artificial neural network, but the scope of the inventive concept is not limited thereto. In this regard, the artificial neural network may include at least one of, for example; a convolution neural network (CNN), a region (R)-based CNN (R-CNN), a region proposal network (RPN), a recurrent neural network (RNN), a stacking (S)-based deep neural network (DNN) (S-DNN), a state (S)-space (S) DNN (S-SDNN), deconvolution network, a deep belief network (DBN), a fully convolutional network, a long short-term memory (LSTM) network, a classification network, etc. Herein, the machine learning model may be referred to as a "model."

The coordinate generator 13 may generate a coordinate $x_{cord}$ for a pattern. For example, if a pattern image $x_{pattern}$ includes one or more pixels, and the coordinate $x_{cord}$ may be used to determine a size of a pixel in the pattern. Thus, in some embodiments, the coordinate $x_{cord}$ may correspond to one pixel. And a distance between adjacent coordinates (e.g., the size of the one pixel) may be proportional to a critical dimension associated with (or defined by) a semiconductor process used to manufacture the integrated circuit. In this regard, the coordinate generator 13 may generate the coordinate $x_{cord}$ corresponding to the pattern image x and as pattern, described hereafter in some additional detail, the coordinate $x_{cord}$ may be used to identify (or provide) the size and coordinate information related to the pattern.

The coordinate transformer 14 may receive the pose latent variable $z_{pose}$, and the coordinate $x_{cord}$, and generate a transformed coordinate $z_{cord}$. As noted above, the pose latent variable $z_{pose}$ may include information regarding the Euclidean transform of the pattern. The coordinate transformer 14 may generate the transformed coordinate $z_{cord}$—in which the Euclidean transform has been reflected in the coordinate $x_{cord}$ generated by the coordinate generator 13. Accordingly, one point in the transformed coordinate $z_{cord}$ may include information regarding the Euclidean transform of the point having the pattern image $x_{pattern}$ corresponding to the point. Coordinate information and the Euclidean transform of the pattern may be considered independent of the content latent variable $z_{content}$, and as a result, the content latent variable $z_{content}$ may represent only attribute(s) required for analysis of the pattern. One example of the coordinate transformer 14 will be described hereafter in some additional detail with reference to FIG. 4.

The second model 12 may receive the content latent variable $z_{content}$ and the transformed coordinate $z_{cord}$, and may output a test pattern image $x'_{pattern}$ and test numeric data $x'_{numeric}$. The second model 12 may correspond to a machine learning model trained in relation to a plurality of sample content latent variables, a plurality of sample pose latent variables, and a plurality of transformed coordinates. The second model 12 may output the test pattern image $x'_{pattern}$ and the test numeric data $x'_{numeric}$, as derived from the content latent variable $z_{content}$ and the transformed coordinate $z_{cord}$, which may then be used to restore the pattern image $x_{pattern}$ and the numeric data $x_{pattern}$.

In some embodiments, the second model 12 may be used to train the first model 11.

In some embodiments, the second model 12 may be used to generate the pattern image $x_{pattern}$ and the numeric data $x_{numeric}$ from the content latent variable $z_{content}$ and the transformed coordinate $z_{cord}$, which are independent of the pattern image $x_{pattern}$ and the numeric data $x_{numeric}$.

In some embodiments, the second model 12 may include mutually independent models. For example, the second model 12 may include one model generating the test pattern image $x'_{pattern}$ from the content latent variable $z_{content}$ and the transformed coordinate $z_{cord}$, and another model generating the test numeric data $x'_{numeric}$ from the content latent variable $z_{content}$ and the transformed coordinate $z_{cord}$.

Referring to FIG. 1, the second model 12 may receive the transformed coordinate $z_{cord}$ as well as the content latent variable $z_{content}$. As described above, the transformed coordinate $z_{cord}$ may include coordinates respectively corresponding to pixels of an image, and accordingly, one coordinate of the transform coordinate $z_{cord}$ may be used to restore one pixel. For example, when it is assumed that the pattern image $x_{pattern}$ has a size of about 50×50 and 2 layers, the transformed coordinate $z_{cord}$ may include an X value and a Y value for each pixel. It follows in this example that the size of the transformed coordinate $z_{cord}$ will be 50×50×2. However, it may be desirable for the content latent variable $z_{content}$ to be uniformly reflected in all pixels. Accordingly, in the context of the test pattern image $x'_{pattern}$, an arbitrary pixel (e.g., an (i, j) pixel) of a particular layer may be generated from an (i, j) value $z_{cord}$ [i, j] of the transformed latent variable $z_{cord}$ and the content latent variable $z_{content}$, wherein 1≤i≤50, and 1≤j≤50.

The cluster generator 15 may collect a plurality of content latent variables respectively corresponding to the plurality of patterns generated by the first model 11, and may cluster the collected content latent variables. In some embodiments, the cluster generator 15 may cluster the plurality of content latent variables based on the Euclidean distances between the content latent variables. The cluster generator 15 may perform clustering based on at least one of, for example; k-center, k-medoid, k-means, etc. Accordingly, in the illustrated example of FIG. 1, the cluster generator 15 may generate 'n' clusters (e.g., $X_1$ through $X_n$), wherein 'n' is an integer greater than 1, and each of the 'n' clusters includes at least one content latent variable (or at least one pattern).

Figure 2:
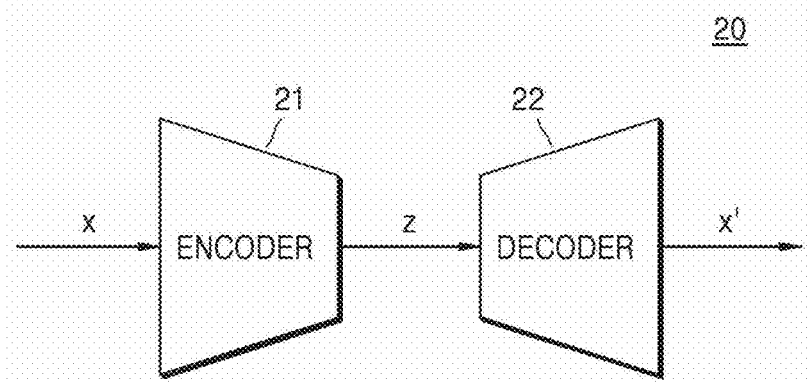
FIG. 2 is a block diagram illustrating a pattern clustering system according to embodiments of the inventive concept.

FIG. 2 is a block diagram illustrating pattern clustering system using a variational auto-encoder (VAE) 20. Here, the VAE 20 may generally include an encoder 21 and a decoder 22. In some embodiments, the first model 11 of FIG. 1 may correspond to the encoder 21 and the second model 12 of FIG. 1 may correspond to the decoder 22.

The encoder 21 may be used to encode (or compress) high-dimensional data x into a low-dimensional latent variable z, and the decoder 22 may be used to decode the low-dimensional latent variable z in order to generate restored high-dimensional data x'. When the encoder 21 compresses the high-dimensional data x, and the decoder 22 thereafter accurately generates restored high-dimensional data x' (e.g., x=x'), latent space associated with latent variable(s) may be accurately evaluated as representing the high-dimensional data without material data loss. Further, the Euclidean distance in latent space may be assumed to be a meaningful metric. Accordingly, similarity between latent variables may be expressed as a Gaussian kernel, which means that a probabilistic density function representing extractability of the latent variable has a Gaussian distribution.

The VAE 20 may be trained in accordance with a loss function expressed below in Equation 1, wherein latent space defined by the encoder 21 represents high-dimensional data as much as possible without loss, and the extractability of the latent variable satisfies the Gaussian distribution:

$$\mathcal{L}(\theta,\varphi) = -\mathbb{E}_{q_\varphi(z|x)}[\log p_\theta(x|z)] + D_{KL}(q_\varphi(z|x) \| \mathcal{N}(0, 1)),$$ [Equation 1]

wherein, x represents high-dimensional data (or an input image), z represents the latent variable, $q_\varphi$ represents the encoder 21, $p_\theta$ represents the decoder 22, and $N(0, 1)$ represents the Gaussian distribution which is a prior distribution of z. Referring to Equation 1, the first term may correspond to a loss rate upon restoration after compression, and the second term may correspond to the difference between the probability density function corresponding to the latent variable and the Gaussian distribution.

Hereinafter, illustrated embodiments of the inventive concept assume the use of VAE 20, but the scope of the inventive concept is not limited thereto. For example, the pattern clustering system 10 of FIG. 1 may use an arbitrary model based on deep learning. Alternately or additionally, the pattern clustering system 10 of FIG. 1 may use a generative adversarial network (GAN) as well as the VAE 20 of FIG. 2.

Figure 3:
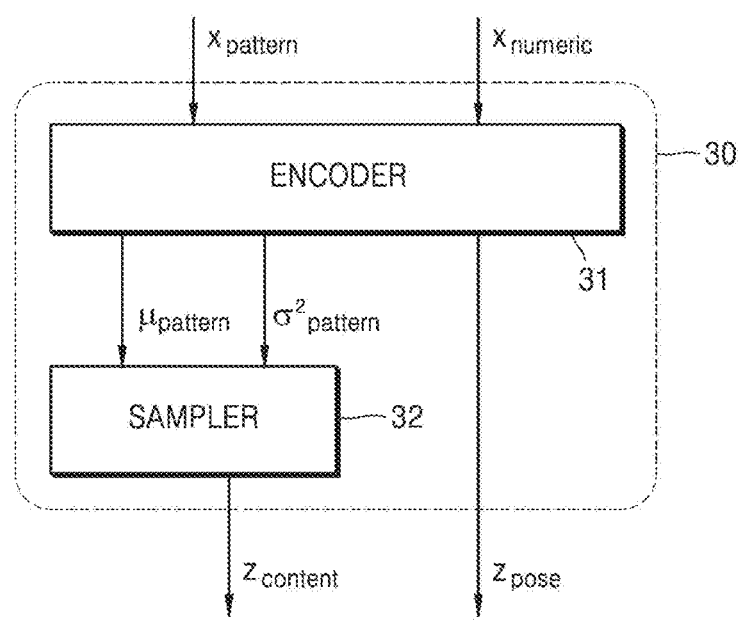
FIG. 3 is a block diagram further illustrating in one example the first model of FIG. 1.

FIG. 3 is a block diagram illustrating a first model 30 including an encoder 31 and a sampler 32 (e.g., one example of a "first sampler"). Here, the first model 30 may be understood as one possible example of the first model 11 of FIG. 1. Accordingly, the first model 30 receives the pattern image $x_{pattern}$ and the numeric data $x_{numeric}$, and outputs the content latent variable $z_{content}$ and the pose latent variable $z_{pose}$, wherein the content latent variable $z_{content}$ includes a real number vector having a dimension in latent space, and the content latent variable $z_{content}$ is a probability variable.

Under the foregoing assumptions a Gaussian distribution may be expressed by Equation 2 that follows:

$$q(z_{content}|x_{pattern}, x_{numeric}) = \mathcal{N}(\mu_{content}; \sigma^{12}_{content}).$$ [Equation 2]

In this regard, the encoder 31 may output an expected center value $\mu_{content}$ and an expected variance $\sigma^2_{pattern}$ from the pattern image $x_{pattern}$ and the numeric data $x_{numeric}$. The sampler 32—in response to the expected center value $\mu_{content}$ and the expected variance $\sigma^2_{pattern}$ received from the encoder 31—and may output the content latent variable $z_{content}$ by performing stochastic sampling on $\mathcal{N}(\mu_{content}, \sigma^2_{content})$ In some embodiments, the sampler 32 may perform stochastic sampling based on a Gaussian re-parameterization trick.

Additionally, the encoder 31 may output the pose latent variable $z_{pose}$. And as noted above in relation to some embodiments, the encoder 31 may include mutually independent models, such as one model generating the expected center value $\mu_{content}$ and the expected variance $\sigma^2_{pattern}$ and another model generating the pose latent variable $z_{pose}$.

Figure 4:
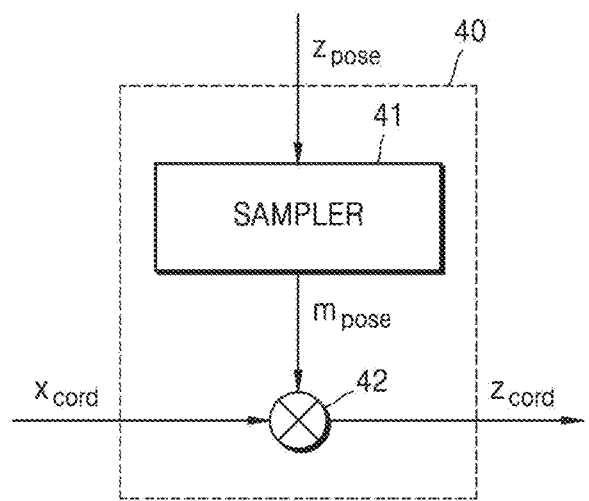
FIG. 4 is a block diagram further illustrating in one example the coordinate transformer of FIG. 1.
Figure 5:
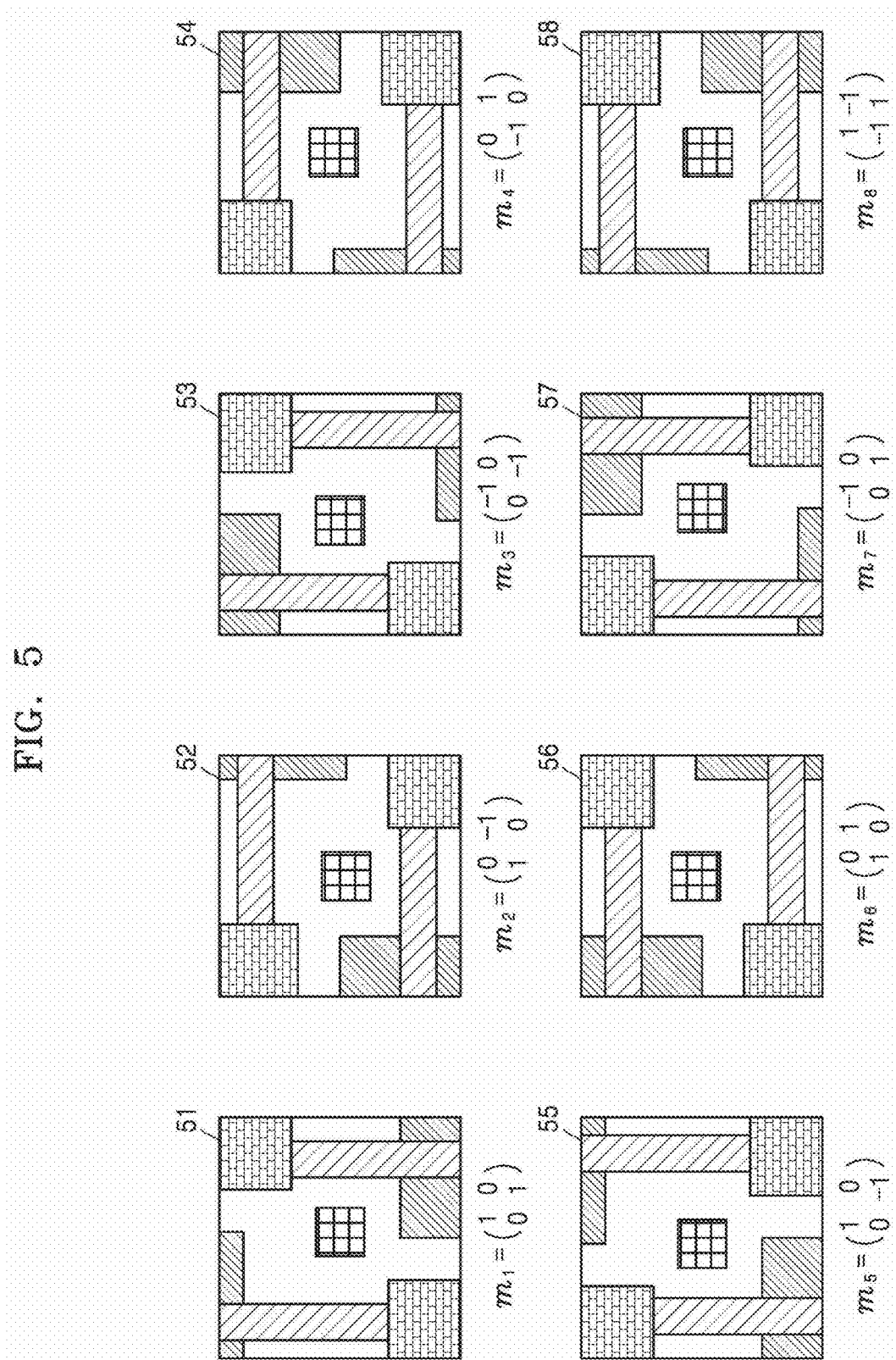
FIG. 5 is a conceptual diagram illustrating examples of Euclidian transform.

FIG. 4 is a block diagram illustrating a coordinate transformer 40 including a second sampler 41 and a multiplier 42, as one possible example of the coordinate transformer 14 of FIG. 1. FIG. 5 is a conceptual a diagram illustrating examples of Euclidean transforms according to embodiments of the inventive concept. Consistent with the description of FIG. 1, the coordinate transformer 40 may receive the pose latent variable $z_{pose}$ and the coordinate $x_{cord}$, and generate the transformed coordinate $z_{cord}$.

In some embodiments, the pose latent variable $z_{pose}$ may include a real number vector having a dimension corresponding to the number of discrete Euclidean transforms. For example, as illustrated in FIG. 5, the pose latent variable $z_{pose}$ may include an eight-dimensional real number vector corresponding to eight transforms included in a dihedral group, wherein each of the eight transforms of the dihedral group is represented by a respective one of a plurality of matrices (e.g., $m_1$ through $m_8$).

Accordingly, a first matrix $m_1$ represents a conversion to a first image 51 substantially the same as an input image; a second matrix $m_2$ represents a conversion to a second image 52 in which the input image has been clockwise rotated by about 90 degrees; a third matrix $m_3$ represents a conversion to a third mage 53 in which the input image has been clockwise rotated by about 180 degrees; and a fourth matrix $m_4$ represents a conversion to an image 54 in which the input image has been clockwise rotated about 270 degrees. Additionally, a fifth matrix $m_5$ represents a conversion to a fifth image 55 in which the input image is reflected, a sixth matrix $m_6$ represents a conversion to a sixth image 56 in which the fifth image 55 has been clockwise rotated about 90 degrees, a seventh matrix $m_7$ represents a conversion to a seventh image 57 in which the fifth image 55 has been clockwise rotated about 180 degrees, and an eighth matrix $m_8$ represents a conversion to an eighth image 58 in which the fifth image 55 has been rotated clockwise about 270 degrees.

Despite the Euclidean transform, such as transforms included in the dihedral group, the attributes of the pattern may be substantially maintained. For example, results of a process simulation or process emulation representing attribute(s) of the pattern may be substantially invariant despite the Euclidean transform. Hereinafter, illustrated embodiments assume that the pose latent variable $z_{pose}$ is an eight-dimensional real number vector corresponding to a dihedral group, but the scope of the inventive concept is not limited thereto. For example, the pose latent variable $z_{pose}$ may be derived using a continuous coordinate transform (e.g., a continuous probability distribution).

Similar to the content latent variable $z_{content}$ described above with reference to FIG. 3, the pose latent variable $z_{pose}$ may be a logit of an 8-dimensional discrete probability distribution. In some embodiments, the pose latent variable $z_{pose}$ may be converted into a probability distribution expressed by Equation 3 below:

$$q(o_{pose}|x_{pattern}) = \text{softmax}(z_{pose}),$$ [Equation 3]

wherein $o_{pose}$ may be an eight-dimensional one-hot vector, and may represent one of the transforms of the dihedral group. For example, $o_{pose}=[0, 1, 0, 0, 0, 0, 0, 0]$ may represent a transform corresponding to the second matrix $m_2$ of FIG. 5.

The second sampler 41 may generate the $o_{pose}$ by performing a stochastic sampling in softmax $(z_{pose})$. In some embodiments, the second sampler 41 may perform the stochastic sampling based on Gumbel softmax re-parameterization. The second sampler 41 may identify a matrix $m_{pose}$ corresponding to a value of the $o_{pose}$ among the plurality of matrices $m_1$ through $m_8$ of FIG. 5, and as illustrated in FIG. 4, may output the matrix $m_{pose}$. Herein, the matrix $m_{pose}$ may be referred to as a matrix operator.

The multiplier 42 may multiply the coordinate $x_{cord}$ by the matrix $m_{pose}$ to output the transformed coordinate $z_{cord}$. As described above with reference to FIG. 1, one point in the transformed coordinate $z_{cord}$ may function as a latent variable including information about the Euclidean transform of a pixel corresponding to the corresponding point.

Figure 6:
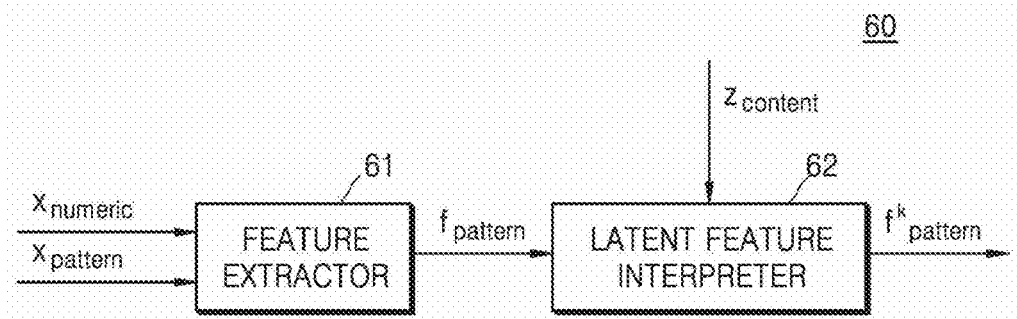
FIG. 6 is a block diagram illustrating an extraction module according to embodiments of the inventive concept.

FIG. 6 is a block diagram illustrating a feature extraction module 60 according to embodiments of the inventive concept. Of note, the pattern clustering system 10 of FIG. 1 may further include the feature extraction module 60.

Referring to FIG. 6, the feature extraction module 60 may include a feature extractor 61 and a latent feature interpreter 62. The feature extractor 61 may extract a feature $f_{pattern}$ from the pattern image $x_{pattern}$ and/or the numeric data $x_{numeric}$. For example, the feature extractor 61 may extract detectable features from the pattern image $x_{pattern}$, such as distances between structures and an area of the structure. In addition, the feature extractor 61 may add the numeric data $x_{numeric}$ to the feature $f_{pattern}$. Accordingly, the feature $f_{pattern}$ may represent attributes of a pattern that may be represented by numeric values, and the feature $f_{pattern}$ may be a real number vector having dimensions corresponding to the number of attributes.

While the content latent variable $z_{content}$ includes information about intrinsic attributes of a pattern, it may not be easy to interpret the physical meaning of the information. In addition, it may be easy to interpret physical meanings from the feature $f_{pattern}$, but it may not be easy to define a pattern only with the feature $f_{pattern}$. For example, patterns of different shapes may also have features of similar values, or patterns having similar attributes may also have features of different values.

The latent feature interpreter 62 may receive the feature $f_{pattern}$ and the content latent variable $z_{content}$, and may output a main feature $f^k_{pattern}$ representing k attributes, wherein k is a positive integer. The latent feature interpreter 62 may identify at least one important attribute in clustering, among the attributes included in the feature $f_{pattern}$ provided by the feature extractor 61, and output the main feature $f^k_{pattern}$ including at least one identified attribute. To this end, the latent feature interpreter 62 may calculate a correlation coefficient between the feature $f_{pattern}$ and the content latent variable $z_{content}$. Accordingly, the cluster may be readily analyzed using attributes having high correlation coefficients with the content latent variable $z_{content}$. In some embodiments, the latent feature interpreter 62 may identify at least one attribute corresponding to a correlation coefficient greater than a predefined threshold, and output the main feature $f^k_{pattern}$ including at least one identified attribute.

Figure 7:
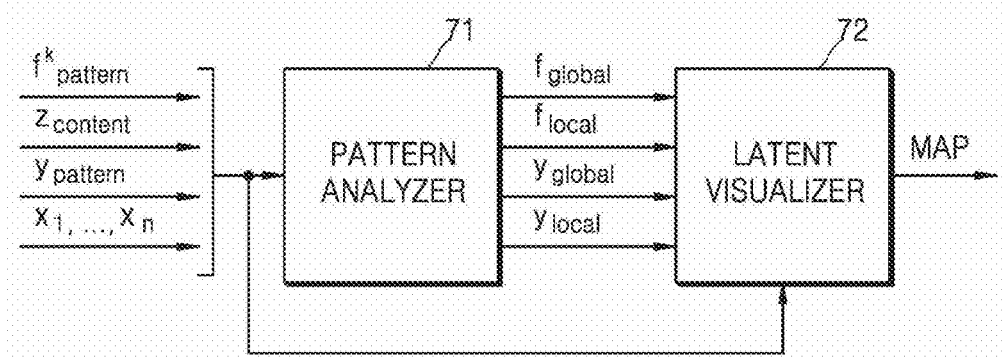
FIG. 7 is a block diagram illustrating a pattern analysis module according to embodiments of the inventive concept.

FIG. 7 is a block diagram illustrating a pattern analysis module 70 according to embodiments of the inventive concept. Of note, the pattern clustering system 10 of FIG. 1 may further include the pattern analysis module 70.

Referring to FIG. 7, the pattern analysis module 70 may include a pattern analyzer 71 and a latent visualizer 72, wherein the pattern analyzer 71 may be used to analyze clusters based on the information described above. For example, the pattern analyzer 71 may receive the main feature $f^k_{pattern}$, the content latent variable $z_{content}$, verification data $y_{pattern}$, and n clusters $X_1$ through $X_n$, and may generate a global feature $f_{global}$, a local feature $f_{local}$, global verification data $y_{global}$, and local verification data $y_{local}$.

The verification data $y_{pattern}$ may be referred to as data generated by verifying a pattern. For example, the verification data $y_{pattern}$ may also be obtained using a process simulation and/or an emulation, and may also be obtained by actually measuring a pattern. In some embodiments, the verification data $y_{pattern}$ may include a value representing the reliability of a pattern, such as a defect rate of the pattern and robustness. More accurate pattern analysis may be possible by utilizing the verification data $y_{pattern}$ as well as information derived from input data, that is, the pattern image $x_{pattern}$ and the numeric data $x_{numeric}$.

In some embodiments, the verification data $y_{pattern}$ may be estimated. The above-described methods of obtaining the verification data $y_{pattern}$ may require a lot of cost (for example, time, computing resources, or the like), and accordingly, it may not be easy to obtain the verification data $y_{pattern}$ corresponding to all pattern images $x_{pattern}$. As described above with reference to the figures, because patterns included in each of the n clusters $X_1$ through $X_n$ may have the same or similar attributes, the verification data $y_{pattern}$ of a pattern may be easily derived from the verification data $y_{pattern}$ of the other pattern included in the same cluster as the pattern.

The pattern analyzer 71 may identify features or verification data for distinguishing clusters, and the feature and verification data may be respectively referred to as the global feature $f_{global}$ and the global verification data $y_{global}$. In addition, the pattern analyzer 71 may identify features or verification data distinguishing patterns included in one cluster, and the features or verification data may be respectively referred to as the local feature $f_{local}$ and the local verification data $y_{local}$. Exemplary operations that may be performed by the pattern analyzer 71 in order to generate the global feature Glom, the global verification data $y_{global}$, the local feature $f_{local}$, and the local verification data $y_{local}$, will be described hereafter with reference to FIGS. 12A, 12B, 12C and 12D.

The latent visualizer 72 may receive the main feature $f^k_{pattern}$, the content latent variable $z_{content}$, the verification data $y_{pattern}$, and the n clusters $X_1$ through $X_n$, which are provided to the pattern analyzer 71, and may receive the global feature $f_{global}$, the global verification data $y_{global}$, the local feature $f_{local}$, and the local verification data $y_{local}$ from the pattern analyzer 71. Although latent space has a lower dimension than the pattern image $x_{pattern}$, it may still be complicated for the user to recognize latent space. Accordingly, the latent visualizer 72 may visualize latent space so that the user may recognize latent space. For example, the latent visualizer 72 may visualize latent space based on a self-organizing map, a principal component analysis, and a t-distribution stochastic neighbor embedding. The latent visualizer 72 may generate a latent space map (MAP), wherein the latent space map may represent the content latent variable $z_{content}$ and the n clusters $X_1$ through $X_n$ and represent features or verification data on the latent variable $z_{content}$, or the n clusters $X_1$ through $X_n$. Accordingly, the user may readily analyze patterns in relation to the latent space map. Examples of possible latent space maps will be described hereafter with reference to FIGS. 8A, 8B, 8C and 8D.

FIGS. 8A, 8B, 8C and 8D are respective diagrams illustrating examples of latent space maps according to embodiments of the inventive concept. Here, the latent visualizer 72 may generate the latent space map (MAP) by visualizing latent space so that a user may recognize latent space. In this regard, the latent visualizer 72 may generate one or more map(s) (e.g., one or more of the examples FIGS. 8A, 8B, 8C and 8D.

Figure 8A:
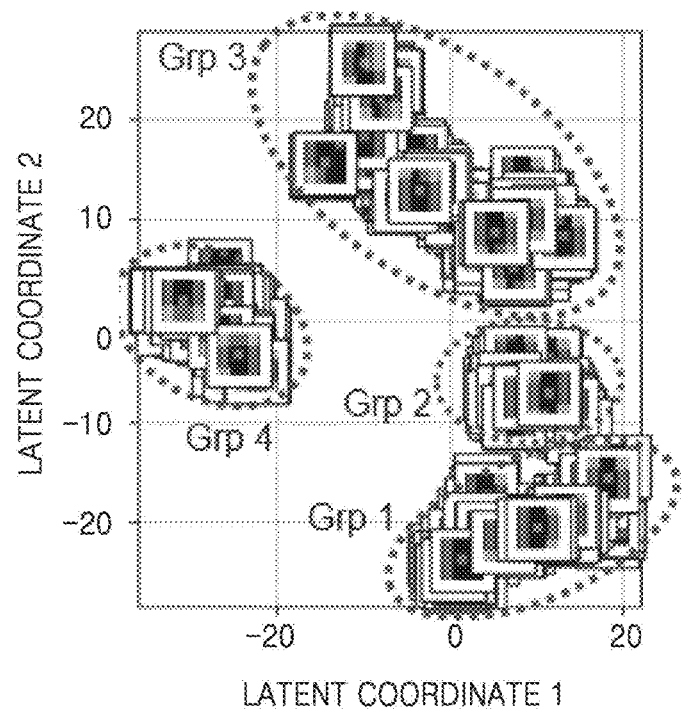

Referring to FIGS. 7 and 8A, the latent space map may represent the n clusters $X_1$ through $X_n$. For example, as illustrated in FIG. 8A, the content latent variables may be grouped into four clusters Grp1 through Grp4 (wherein n=4). In addition, in FIG. 8A, latent space map may represent a pattern image on a content latent variable, and as illustrated in FIG. 8A, patterns included in the same cluster may have similar shapes.

Referring to FIGS. 7 and 8B, latent space map may represent the verification data $y_{pattern}$ on the content latent variables. For example, as illustrated in FIG. 8B, each of the content latent variables may be colored in a color corresponding to its own verification data $y_{pattern}$.

Referring to FIGS. 7 and 8C, latent space map may represent the global feature $f_{global}$ or the global verification data $y_{global}$ on the content latent variables. For example, as illustrated in FIG. 8C, each of the content latent variables may be colored in a color corresponding to its own global feature $f_{global}$ or global verification data $y_{global}$. As illustrated in FIG. 8C, patterns included in the same cluster may have similar global features $f_{global}$ or global verification data $y_{global}$, while each of the four clusters Grp1 through Grp4 may have a unique similar global feature $f_{global}$ or global verification data $y_{global}$.

Referring to FIGS. 7 and 8D, latent space map may represent the local feature $f_{local}$ or local verification data $y_{local}$ on content latent variables. For example, as illustrated in FIG. 8D, each of the content latent variables may be colored in a color corresponding to the local feature $f_{local}$ or the local verification data $y_{local}$. As illustrated in FIG. 8D, each of the four clusters Grp1 through Grp4 may include patterns having the local feature $f_{local}$ or the local verification data $y_{local}$ of various values, and a tendency of the local feature $f_{local}$ or local verification data $y_{local}$ may be identified from patterns included in one cluster from latent space map.

FIG. 9 is a flowchart illustrating a method of pattern clustering according to embodiments of the inventive concept. In some embodiments, the method of FIG. 9 may be performed by the pattern clustering system 10 of FIG. 1.

Referring to FIGS. 1 and 9, the pattern image $x_{pattern}$ and the numeric data $x_{numeric}$ may be provided to the first model 11 (S12). The pattern image $x_{pattern}$ may include 2D geometric information, and the numeric data $x_{numeric}$ may include information about a pattern not included in the pattern image $x_{pattern}$. In some embodiments, the pattern image $x_{pattern}$ may include at least one 2D array, and the numeric data $x_{numeric}$ may be a real number vector.

The content latent variable $z_{content}$ and the pose latent variable $z_{pose}$ may be obtained (S14). For example, the first model 11 may correspond to a machine learning model trained by a plurality of sample pattern images and a plurality of values, and may output the content latent variable $z_{content}$ and the pose latent variable $z_{pose}$ in response to the pattern image $x_{pose}$ and the pattern numeric data $x_{numeric}$. The content latent variable $z_{content}$ may correspond to a single point in latent space, and the pose latent variable $z_{pose}$ may represent the Euclidean transform of a pattern in the pattern image $x_{pattern}$. Due to the pose latent variable $z_{pose}$, the content latent variable $z_{content}$ may represent attributes of a pattern independent of the Euclidean transform.

A determination is now made as to whether there is an additional pattern (S16). In this regard, so long as there is another pattern to be provided to the first model 11 from among the patterns subject to pattern clustering in relation to the integrated circuit (S16=YES), the foregoing method steps (e.g., S12, S14, and S16) may be repeated.

However, upon determining that there is no additional pattern (S16=NO), a plurality of latent variables may be grouped into a plurality of clusters (S18). For example, the cluster generator 15 may collect the plurality of latent variables from the first model 11, and may cluster the plurality of latent variables based on the Euclidean distances between the collected plurality of latent variables. Accordingly, the n clusters (e.g., $X_1$ through $X_n$) may be generated, wherein latent variables are included in each cluster (e.g., patterns having similar attribute(s)).

FIG. 10 is a flowchart illustrating a method of training a model that may be used in relation to embodiments of the inventive concept. In some embodiments, the method of FIG. 10 may be performed by the pattern clustering system 10 of FIG. 1.

Referring to FIGS. 1 and 10, the content latent variable $z_{content}$ and the transformed coordinate $z_{cord}$ may be provided to the second model 12 (S22), wherein the content latent variable $z_{content}$ represents a point corresponding to a pattern in latent space, and the transformed coordinate $z_{cord}$ is generated from the pose latent variable $z_{pose}$ and the coordinate $x_{cord}$ output by the first model 11.

A test pattern image $x'_{pattern}$ may be obtained (S24). For example, the second model 12 may generate and output the test pattern image $x'_{pattern}$ in response to the content latent variable $z_{content}$ and the transformed coordinate $z_{cord}$. Here, the test pattern image $x'_{pattern}$ may correspond to a pattern image restored from the content latent variable $z_{content}$ and the transformed coordinate $z_{cord}$, and the first model 11 and the second model 12 may be trained such that the test pattern image $x'_{pattern}$ becomes more similar to the pattern image $x_{pattern}$ provided to the first model 11.

The first model 11 and the second model 12 may be trained (S26). In some embodiments, the first model 11 and the second model 12 may be trained in accordance with the foregoing description of Equation 1 to minimize a loss function expressed by Equation 4 that follows:

$$\mathcal{L}(\theta,\varphi) = -\mathbb{E}_{q_\varphi}[\log p_\theta(x_{pattern}, x_{numeric}|z_{pattern}, z_{cord})] + D_{KL}(q_\varphi(z_{content}|x_{pattern}, x_{numeric}) \| \mathcal{N}(0,1)) + D_{KL}(q_\varphi(o_{pose}|x_{pattern}) \| \mathcal{U}(K)),$$

wherein U(K) represents discrete uniform distribution which is a previous distribution of the $o_{pose}$. In this case, K may be a number of possible transforms. For example, as described above with reference to FIG. 5 wherein K=8, eight transforms of the dihedral group having uniform probability may be represented.

Here, it should be noted that reduced dimensionality of latent space is advantageous. For example, the lesser the dimension of latent space, the less information the content latent variable $z_{content}$ may include. Accordingly, the content latent variable $z_{content}$ may include only essential information, and as a result, all information related to the Euclidean transform may be included in the pose latent variable $z_{pose}$. However, it should be further noted, that if dimensionality of latent space becomes too small, the content latent variable $z_{content}$ may omit certain essential information. Accordingly, it is important to carefully determine the dimensionality of latent space. In some embodiments, as the dimensionality of latent space is reduced, an absolute value of the first term of Equation 4 (e.g., an absolute value corresponding to a decoder) may increase. Accordingly, the dimensionality of latent space may be determined by comparing the absolute value of the first term of Equation 4 to a threshold.

FIG. 11 is a flowchart illustrating a method of generating the transformed coordinate $z_{cord}$ provided to the second model 12 that may be used in certain embodiments of the inventive concept. In some embodiments, the method of FIG. 11 may be performed using the pattern clustering system 10 of FIG. 1.

Referring to FIGS. 1 and 11, the coordinate word may be generated (S32). Here, the coordinate $x_{cord}$ may determine a size corresponding to one pixel in a pattern. The coordinate generator 13 may generate the coordinate $x_{cord}$ corresponding to the pattern image $x_{pattern}$.

The Euclidean transform of the pattern may be identified (S34). For example, the coordinate transformer 14 may receive the pose latent variable $z_{pose}$ from the first model 11. When the Euclidean transform is limited to transforms included in the dihedral group, the pose latent variable $z_{pose}$ may be a logit of an eight-dimensional discrete probability distribution. The pose latent variable $z_{pose}$ may be transformed into a probability distribution using softmax, and one of the transforms included in the dihedral group may be identified using sampling of the probability distribution.

The coordinate $x_{cord}$ may be transformed (S36). For example, the coordinate transformer 14 may obtain a matrix corresponding to the identified Euclidean transform, and may generate the transformed coordinate $z_{cord}$ by multiplying the obtained matrix by the coordinate $x_{cord}$. The transformed coordinate $z_{cord}$ may then be provided to the second model 12 (S38). For example, the coordinate transformer 14 may provide the transformed coordinate $z_{cord}$ to the second model 12. In this regard, the second model 12 may receive the transformed coordinate $z_{cord}$ in order to restore a pattern image from the content latent variable $z_{content}$.

FIGS. 12A, 12B, 12C and 12D are respective flowcharts illustrating various methods of pattern clustering according to embodiments of the inventive concept. That is, the flowcharts of FIGS. 12A, 12B, 12C and 12D illustrate respective methods of extracting global features, local features, global verification data, and local verification data. In some embodiments, the methods of FIGS. 12A, 12B, 12C and 12D may be performed in the pattern analyzer 71 of FIG. 7.

Figure 12A:
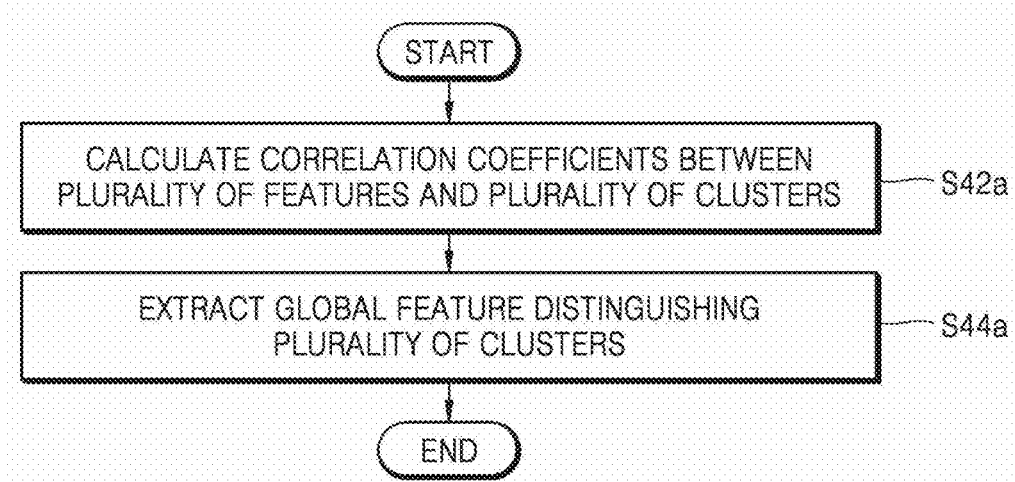

Referring to FIGS. 7 and 12A, a plurality of features and correlation coefficients between a plurality of clusters may be calculated (S42a), and a global feature distinguishing the plurality of clusters may be extracted (S44a). In this regard, the global feature $f_{global}$ may have a value distinguishing clusters. To extract the global feature Glom from the main feature $f^k_{pattern}$, correlation coefficients between the main feature $f^k_{pattern}$ and the clusters may be calculated. In some embodiments, at least one feature corresponding to a correlation coefficient greater than a predefined threshold may be included in the global feature $f_{global}$.

Referring to FIGS. 7 and 12B, correlation coefficients between the plurality of features and the content latent variables included in the clusters may be calculated (S42b), and local features distinguishing the plurality of content latent variables may be extracted (S44b). Here, the local feature $f_{local}$ may have a value distinguishing the content latent variables included in one cluster, that is, patterns. To extract the local feature $f_{local}$ from the main feature $f^k_{pattern}$, correlation coefficients between the main feature $f^k_{pattern}$ and the content latent variables included in one cluster may be calculated. In some embodiments, at least one feature corresponding to a correlation coefficient greater than a predefined threshold may be included in the local feature $f_{local}$.

Referring to FIGS. 7 and 12C, correlation coefficients between verification data and the plurality of clusters may be calculated (S42c), and global verification data distinguishing the plurality of clusters may be extracted (S44c). Here, the global verification data $y_{global}$ may have a value distinguishing the clusters. To extract the global verification data $y_{global}$ from the verification data $y_{pattern}$, correlation coefficients between attributes representing the verification data $y_{pattern}$ and the clusters may be calculated. In some embodiments, at least one attribute corresponding to a correlation coefficient greater than a predefined threshold may be included in the global verification data $y_{global}$.

Figure 12D:
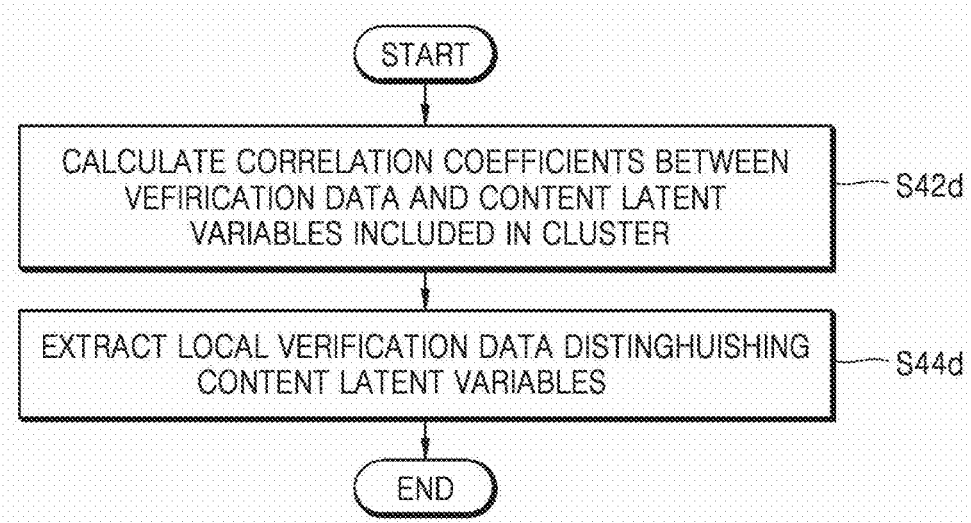

Referring to FIGS. 7 and 12D, correlation coefficients between the content latent variables included in the verification data and the clusters may be calculated (S42d), and at least one local verification data distinguishing the content latent variables may be extracted (S44d). Here, the local verification data $y_{local}$ may have a value distinguishing the content latent variables included in one cluster, that is, patterns. To extract the local verification data $y_{local}$ from the verification data $y_{pattern}$, correlation coefficients between attributes representing the verification data $y_{pattern}$ and the content latent variables included in one cluster may be calculated. In some embodiments, at least one attribute corresponding to a correlation coefficient greater than a predefined threshold may be included in the local verification data $y_{local}$.

FIG. 13 is a block diagram illustrating a computer system 130 according to embodiments of the inventive concept. In some embodiments, the computer system 130 of FIG. 13 may perform training of machine learning models used for pattern clustering described above, and may be referred to as a pattern clustering system, a training system, etc.

The computer system 130 may be implemented using a general purpose computing system or special purpose computing system. For example, the computer system 130 may be implemented using a personal computer (PC), a server, a laptop PC, a home appliance, an automobile etc. As illustrated in FIG. 13, the computer system 130 may include at least one processor 131, a memory 132, a storage system 133, a network adapter 134, an input/output (I/O) interface 135, and a display 136.

The at least one processor 131 may execute a program module including a computer system executable instruction. The program module may include routines, programs, objects, components, logic, data structures, or the like that perform a particular task or implement a particular abstract data type. The memory 132 may include a computer system readable medium in a form of a volatile memory, such as random access memory (RAM). The at least one processor 131 may access the memory 132, and execute instructions loaded on the memory 132. The storage system 133 may non-transitorily store information, and include at least one program product including a program module configured to perform training on machine learning models for the pattern clustering described above with reference to the diagrams in some embodiments. The program may include, as non-limiting examples, an operating system, at least one application, other program modules, and program data.

The network adapter 134 may provide access to a local area network (LAN), a wide area network (WAN), and/or a public network (for example, the Internet). The I/O interface 135 may provide a communication channel with a peripheral device, such as a keyboard, a pointing device, an audio system, etc. The display 136 may output various pieces of information so that the user may identify various pieces of information.

In some embodiments, training of the machine learning models for the pattern clustering consistent with embodiments of the inventive concept may be implemented as a computer program product. The computer program product may include a non-transitory computer-readable medium (or storage medium) including computer-readable program instructions allowing the at least one processor 131 to perform image processing and/or training of models. Computer-readable instructions may include, as non-limiting examples, assembler instructions, instruction set architecture (ISA) instructions, machine instructions, machine-dependent instructions, micro-code, firmware instructions, state setting data, or source code or object code written in at least one programming language.

The computer-readable medium may include any type of medium capable of non-transitorily holding and storing instructions executed by at least one processor 131 or any instruction-executable device. The computer-readable medium may include an electronic storage device, a magnetic storage device, an optical storage device, an electromagnetic storage device, a semiconductor storage device, or any combination thereof, but is not limited thereto. For example, the computer-readable medium may include at least one of, for example; a portable computer diskette, a hard disc, a random access memory (RAM) such as a dynamic RAM (DRAM) or a static RAM (SRAM), a read-only memory (ROM), an electrically usable ROM (EEPROM), flash memory, a compact disc (CD), a digital versatile disc (DVD), a memory stick, a floppy disk, etc.

FIG. 14 is a block diagram illustrating a system 140 capable of performing pattern clustering according to embodiments of the inventive concept.

Referring to FIG. 14, the system 140 may include at least one processor 141, a memory 143, an artificial intelligence (AI) accelerator 145, and a hardware accelerator 147, and the at least one processor 141, the memory 143, the AI accelerator 145, and the hardware accelerator 147 may communicate with each other via a bus 149. In some embodiments, the at least one processor 141, the memory 143, the AI accelerator 145, and the hardware accelerator 147 may also be included in one semiconductor chip. In addition, in some embodiments, at least two of the at least one processor 141, the memory 143, the AI accelerator 145, and the hardware accelerator 147 may also be included in each of two or more semiconductor chips mounted on a board.

The at least one processor 141 may execute instructions. For example, the at least one processor 141 may also execute an operating system by executing instructions stored in the memory 143 or may also execute applications running on the operating system. In some embodiments, the at least one processor 141 may instruct tasks of the AI accelerator 145 and/or the hardware accelerator 147 by executing instructions, and may also obtain a result of performing the task from the AI accelerator 145 and/or the hardware accelerator 147. In some embodiments, the at least one processor 141 may include an application specific instruction set processor (ASIP) customized for a specific use, and may also support a dedicated instruction set.

The memory 143 may have an arbitrary structure for storing data. For example, the memory 143 may also include a volatile memory device, such as a DRAM or SRAM, and/or a non-volatile memory device, such as flash memory and RRAM. The at least one processor 141, the AI accelerator 145, and the hardware accelerator 147 may store data in the memory 143, or read the data from the memory 143.

The AI accelerator 145 may be referred to as hardware designed for AI applications. In some embodiments, the AI accelerator 145 may include a neural processing unit (NPU) for implementing a neuromorphic structure, may generate output data by processing input data provided by the at least one processor 141 and/or the hardware accelerator 147, and may provide output data to the at least one processor 141 and/or the hardware accelerator 147. In some embodiments, the AI accelerator 145 may be programmable, and may be programmed by the at least one processor 141 and/or the hardware accelerator 147.

The hardware accelerator 147 may be referred to as hardware designed to perform a specific task at a high speed. For example, the hardware accelerator 147 may be designed to perform data transform at a high speed, such as demodulation, modulation, encoding, and decoding. The hardware accelerator 147 may be programmable, and may be programmed by at least one processor 141 and/or the hardware accelerator 147.

In some embodiments, the AI accelerator 145 may execute machine learning models described above with reference to diagrams. For example, the AI accelerator 145 may execute each of the above-described layers. The AI accelerator 145 may generate an output including useful information by processing input parameters, feature maps, etc. In addition, in some embodiments, at least some of the models executed by AI accelerator 145 may be executed by the at least one processor 141 and/or the hardware accelerator 147.

While the inventive concept has been particularly shown and described with reference to embodiments thereof, it will be understood that various changes in form and details may be made therein without departing from the scope of the following claims.

What is claimed is:

1. A method of clustering patterns of an integrated circuit, the method comprising:
   for each pattern among a plurality of patterns,
      providing a pattern image to a first model, wherein the first model is trained using a plurality of sample images; and
      generating a content latent variable and a pose latent variable using the first model in response to the pattern image, wherein the pose latent variable has a value corresponding to an Euclidean transform of each pattern; and thereafter, grouping a plurality of content latent variables, each respectively corresponding to a pattern among the plurality of patterns, into a plurality of clusters corresponding to the plurality of patterns based on a Euclidean distance;
   generating a coordinate in response to the pattern image;
   identifying an Euclidean transform of the pattern image by sampling a probability distribution of the pose latent variable;
   transforming the coordinate in response to the Euclidean transform of the pattern image to generate a transform coordinate;
   providing the transform coordinate to a second model; and
   generating a test pattern image using the second model in response to the transform coordinate and the content latent variable.

2. The method of claim 1, wherein the pose latent variable includes a vector including eight real numbers respectively corresponding to eight transforms included in a dihedral group.

3. The method of claim 1, further comprising:
   providing the content latent variable to the second model, wherein the second model is trained using a plurality of sample content latent variables; and
   training at least one of the first model and the second model using the test pattern image.

4. The method of claim 1, further comprising:
providing numeric data to the first model, wherein the numeric data represents at least one attribute of a pattern among the plurality of patterns, and
the generating of the content latent variable and the pose latent variable using the first model is performed in response to the pattern image and the numeric data.

5. The method of claim 1, further comprising:
extracting at least one feature of the pattern image; and
extracting at least one main feature from the at least one feature in response to the content latent variable.

6. The method of claim 5, wherein the extracting of the at least one main feature includes:
calculating first correlation coefficients between the at least one feature and the plurality of clusters; and
extracting the at least one main feature distinguishing the plurality of clusters in response to the first correlation coefficients.

7. The method of claim 5, wherein the extracting of the at least one main feature includes:
calculating second correlation coefficients between the at least one feature and content latent variables included in one cluster among the plurality of clusters; and
extracting the at least one main feature distinguishing the content latent variables included in the one cluster in response to the second correlation coefficients.

8. The method of claim 1, further comprising:
obtaining verification data associated with the pattern image; and
calculating correlation coefficients between the verification data and the plurality of clusters.

9. The method of claim 8, further comprising:
visualizing the plurality of clusters and the verification data.

10. A method of clustering patterns of an integrated circuit, the method comprising:
providing a pattern image and numeric data, as input data corresponding to a first pattern to a first model, wherein the first model is trained by a plurality of sample images and a plurality of sample values;
obtaining a content latent variable and a pose latent variable using the first model; and
grouping a plurality of content latent variables corresponding to a plurality of patterns into a plurality of clusters based on a Euclidean distance,
wherein the numeric data represents at least one attribute of the first pattern;
generating a coordinate in response to the pattern image;
identifying an Euclidean transform of the pattern image by sampling a probability distribution of the pose latent variable;
transforming the coordinate in response to the Euclidean transform of the pattern image to generate a transform coordinate;
providing the transform coordinate to a second model; and
generating a test pattern image using the second model in response to the transform coordinate and the content latent variable.

11. The method of claim 10, further comprising:
extracting a plurality of features in response to at least one of the pattern image and the numeric data; and
extracting at least one main feature from the plurality of features and the plurality of clusters.

12. The method of claim 11, wherein the extracting of the at least one main feature comprises:
calculating first correlation coefficients between the plurality of features and the plurality of clusters; and
extracting the at least one main feature distinguishing the plurality of clusters in response to the first correlation coefficients.

13. The method of claim 12, wherein the extracting of the at least one main feature further comprises:
calculating second correlation coefficients between the plurality of features and content latent variables included in one cluster among the plurality of clusters; and
extracting the at least one main feature distinguishing the content latent variables included in the one cluster in response to the second correlation coefficients.

14. The method of claim 11, further comprising:
visualizing the plurality of clusters and the at least one main feature.

15. A system comprising:
at least one processor; and
a non-transitory storage medium storing instructions, which when executed by the at least one processor, allows the at least one processor to cluster patterns of an integrated circuit,
wherein clustering the patterns comprises:
providing a pattern image corresponding to a first pattern to a first model, wherein the first model is trained by a plurality of sample images;
obtaining a first content latent variable and a first pose latent variable from the first model; and
grouping a plurality of content latent variables corresponding to a plurality of patterns into a plurality of clusters based on a Euclidean distance, wherein the first pose latent variable represents a Euclidean transform of the first pattern with respect to a representative pattern of a first cluster including the first content latent variable;
generating a first coordinate corresponding to the pattern image;
identifying the Euclidean transform of the first pattern by sampling a probability distribution of the first pose latent variable;
transforming the first coordinate based on the Euclidean transform of the first pattern to generate a transformed first coordinate;
providing the transformed first coordinate to a second model; and
obtaining a first test pattern image from the second model in response to the transformed first coordinate and the first content latent variable.

16. The system of claim 15, wherein the clustering of patterns further comprises:
providing the first content latent variable to the second model, wherein the second model is trained by a plurality of sample content latent variables; and
training the first model and the second model based on the pattern image and the first test pattern image.

17. The system of claim 16, wherein the second model is trained by the plurality of sample content latent variables and a plurality of sample coordinates.

18. The system of claim 15, wherein the first model is trained using the plurality of sample images and a plurality of sample values, and
the clustering of patterns further comprises providing first numeric data representing at least one attribute of the first pattern to the first model.

19. The system of claim 15, wherein the clustering of patterns further comprises:
   obtaining verification data of the first pattern; and
   calculating correlation coefficients between the verification data and the plurality of clusters.

\* \* \* \* \*